United States Patent [19]

van Pelt et al.

[11] 4,405,708

[45] Sep. 20, 1983

[54] METHOD OF APPLYING A RESIST PATTERN ON A SUBSTRATE, AND RESIST MATERIAL MIXTURE

[75] Inventors: Pieter van Pelt, Sunnyvale, Calif.; Jacob Wijdenes, Eindhoven, Netherlands

[73] Assignee: U.S. Philips Corporation, New York, N.Y.

[21] Appl. No.: 355,977

[22] Filed: Mar. 8, 1982

[30] Foreign Application Priority Data

Mar. 12, 1981 [NL] Netherlands .......................... 8101200

[51] Int. Cl.³ .......................... G03C 5/00; G03C 1/68
[52] U.S. Cl. .................................... 430/281; 430/285; 430/296; 430/326; 430/313; 430/905; 430/907
[58] Field of Search ............... 430/281, 296, 285, 326, 430/907, 905, 192, 175, 176, 197, 313

[56] References Cited

U.S. PATENT DOCUMENTS 3,402,044  9/1968  Steinhoff et al. .................... 430/326
3,900,325  8/1975  Christensen et al. ............... 430/192
3,996,393  12/1976  Cortellino et al. .................. 430/296
4,141,733  2/1979  Guild .................................... 430/326
4,272,603  6/1981  Chenevert et al. ................. 430/192

OTHER PUBLICATIONS

Brault et al., "A Method for Rapidly Screening Polymers as Electron Beam Resists" J. Electrochem. Soc. May 1981, pp. 1158–1161.

*Primary Examiner*—Mary F. Downey
*Attorney, Agent, or Firm*—Norman N. Spain

[57] ABSTRACT

A method of applying a resist pattern on a substrate and resist material mixture.

Resist materials which are applied in accordance with a specific resist pattern are employed in the production of integrated circuits. It has been found that the addition of a certain type of negative-working resist material, namely polystyrene and polystyrene derivatives, to positive-working resist materials results in a resist material mixture having an increased resistance to plasma etching.

4 Claims, No Drawings

METHOD OF APPLYING A RESIST PATTERN ON A SUBSTRATE, AND RESIST MATERIAL MIXTURE

The invention relates to a method of applying a resist pattern on a substrate, a resist material being applied uniformly distributed on the substrate, the resist material mixture being locally irradiated with actinic radiation and the irradiated portion removed. The invention also relates to a novel type of resist material mixture.

During the production of integrated circuits, what are known as large scale and very large scale integrated circuits in particular, portions of the substrate must be shielded for some stage of the production process. This is generally performed by locally applying resist material in a specific pattern on the substrate. Masks are often used during the production of circuits of this type; these masks are produced using resist materials.

Once the resist material has been applied in a specific pattern, the substrate and the layers provided thereon are subjected to further treatments, often by means of plasma etching. It is then a requirement that the resist material is attacked to the least possible extent by the plasma etching operation.

The invention provides the possibility to increase the resistance of existing resist materials to plasma etching and deals with the use of such improved resist materials.

The method according to the invention is characterized in that as the resist material mixture a mixture is used which comprises a positive-working resist material and 1-25% by weight of a polystyrene defined by the formula:

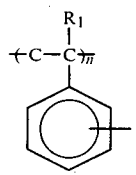

wherein $R_1$ respresents an H-atom or an alkyl group, n represents the degree of polymerization and $R_2$ represents a halogen atom, an alkyl or an alkoxy group.

The resist material mixture in accordance with the invention comprises a positive-working resist and 1-25% by weight of polystyrene defined by the above-indicated formula. In this description "polystyrene" is always understood to mean one of the many compounds defined by the above-indicated formula.

Mixtures of resist materials on the basis of copolymers, which partly consist of styrene, partly of acrylates are known per se from French Patent Application No. 2,211,489.

The invention is based on the surprising discovery that adding a certain type of negative-working resist materials, namely polystyrene as defined above, to positive resist materials results in resist material mixtures with a positive character, which have a significantly improved resistance to plasma etching. This improvement was greater than might be expected on the basis of the properties of the separate components of the mixtures in accordance with the invention. Adding other compounds with aromatic groups did not result in the desired improvement of the resistance to plasma etching.

Good results are obtained when mixtures are used which comprise 1-25% by weight of poly(p-tert. butyl)styrene.

The polystyrene is preferably present in the mixture in a quantity from 1-25% by weight. Still greater preference must be given to a quantity of 1-15% by weight. It generally holds that when polystyrene having a high molecular weight is used, a smaller quantity will be sufficient. At quantities less than 1% by weight the desired effect occurs to an insufficient degree. Quantities of more than 25% by weight, sometimes even more than 15% by weight, are usually not compatible, that is to say are not properly mixable with the further components of the resist material mixture.

Mixing the polystyrene with the positive resist material may be performed in all conventional manners: mixing solutions, mixing dry materials and so forth.

All known positive-working resist materials are suitable for use as a positive-working resist material. Within the framework of this description, they include in any case the so-called electron beam resists, photo resists and deep UV resists of the positive type.

The invention will now be described in greater detail by way of example with reference to the following Examples.

EXAMPLE 1

Determination of resistance to plasma etching.

Each one of the polymers mentioned hereafter was applied on a separate silicon wafer in a layer thickness of approximately 1 μm. The applied layers were thermally treated to remove the solvent. Patterns may be formed in the wafers thus obtained by local exposure to UV light or to electron beams, followed by developing. In this example no patterns were applied.

The uniformly coated wafers were subjected to a plasma etching operation. In the following Table A the decrease in thickness of the resist layer is given as the etching rate. In identical circumstances the etching rate of silicon was 53 nanometers per minute.

TABLE A

| material | thermal treatment | etching process | etching rate nanometer/p.min. |
|---|---|---|---|
| polymethylmethacrylate (PMMA) | 20 min. 150° C. | planar reactor C Cl4 plasma 400 watt 3 minutes | 147 |
| PMMA + 9 wt. % poly(α methylstyrene)(PMS) | 20 min. 150° C. | planar reactor C Cl4 plasma 400 watt 3 minutes | 33 |
| PMS | 20 min. 150° C. | planar reactor C Cl4 plasma 400 watt 3 minutes | 10 |
| PMMA | 20 min. 150° C. | C Cl4/Cl2 plasma, planar reactor 500 watt, 5 min. | >130 |
| PMMA + 5 wt. % PMS | 20 min. 150° C. | C Cl4/Cl2 plasma, planar reactor 500 watt, | 50 |

TABLE A-continued

| material | thermal treatment | etching process | etching rate nanometer/p.min. |
|---|---|---|---|
| PMMA + 10 wt. % PMS | 20 min. 150° C. | 5 min. C Cl$_4$/Cl$_2$ plasma, planar reactor 500 watt, 5 min. | 32 |
| polymethyliso-propenylketone | 20 min. 150° C. | C Cl$_4$/Cl$_2$ plasma, planar reactor 500 watt, 5 min. | 36 |
| id. + PMS | 20 min. 150° C. | C Cl$_4$/Cl$_2$ plasma, planar reactor 500 watt, 5 min. | 30 |

The molecular weight of the PMS was stated by the manufacturer to be 60.000: weight-average molecular weight PMMA $10.3 \times 10^4$; number-average molecular weight PMMA $7.3 \times 10^4$.

The sensitivity of the said resist materials was hardly modified by the addition of poly (α-methylstyrene).

EXAMPLE 2

This example was performed in the same way as specified in Example 1. A copolymer of methylmethacrylate copolymerized with 10% isobutylmethacrylate (I); (I) plus 10% by weight of PMS; a cross-linked methacrylate resist as described in Applied Polymer Symposium, no. 23, pages 87, John Wiley and Sons, New York (1974) and in United Kingdom Pat. No. 1,445,345 (II) and (II) plus 10% by weight of PMS, respectively were used as the resist material. Before the etching rate was determined, the resist materials were locally exposed to an electron beam and developed in methyl isobutyl ketone.

Plasma etching in a planar reactor using a chlorine/oxygen carbon monoxide plasma (100 cc Cl$_2$: 8cc O$_2$: 40 cc CO), 60°, 400 W, 10 minutes had the following results as regards the etching rate (Δ):

Δ(I+10% PMS)=0.63×ΔI and

Δ(II+10% PMS)=0.8×Δ (II).

Etching in a carbon tetrachloride/chlorine (40%) plasma at 500 W and 80 milliTorr in a planar reactor furnished the results included in the following Table B.

TABLE B

| Resist material | etching rate (nm/min.) |
|---|---|
| I | 212 |
| I + 10 wt. % PMS | 73 |
| II | 231 |
| II + 10 wt. % PMS | 64 |
| silicon | 34; 40 |

The sensitivity and the other properties of the resist material were not essentially influenced by the addition of PMS.

EXAMPLE 3

In this Example use was made of polymethylmethactylate (PMMA) having a molecular weight of 600.000, dissolved in ethyl cellosolve acetate and polymethyl isopropenyl ketone (PMIK) (molecular weight 180.000) dissolved in cyclohexanon, respectively. Polystyrene compounds as specified in Table C were added to these solutions. All the quantities are calculated on the basis of the quantity of solid material in the resin solution. After dissolving of the polystyrene compounds, the solutions obtained were filtered through a 5 μm millipore teflon filter in order to remove the solid particles still present. Silicon plates were provided with a resin solution layer by spin coating. The applied layer was prefired at 90° C. for 30 minutes. The layer thickness was measured and thereafter the layers were etched by means of a plasma. The etching operation involved was a standard planar CCl$_4$ etching treatment at a pressure of 70 mm Torr, a current intensity ($I_{RF}$) of 1 A, at 536 V. The substrate was kept at a temperature of 60° C. After plasma etching the thickness of the remaining layer was measured and the etching rate was calculated in nanometers per minute. Some resist layers had an irregular surface which made it difficult to measure the thickness. Firing at 20 minutes at 180° C. yielded a layer whose thickness could be easily determined. The results are shown in Table C.

At the same time some tests were made with a few different copounds which, just like the polystyrene, contained aromatic groups, namely novolak and p-tert-butyl-benzoic acid. The results obtained with these two compounds are also shown in Table C. From these results it can be deduced that the presence of aromatic groups is not the cause of the improved resistance to plasma etching.

TABLE C

| | etching rate nm/min. | |
|---|---|---|
| Resist material mixture | after 3 min. etching | after 5 min. etching |
| PMMA | 80 | 105 |
| PMMA + 5% polystyrene[1] | 65 | 85 |
| PMMA + 10% polystyrene[1] | 55 | 65 |
| PMMA + 20% polystyrene[1] | 35 | 50 |
| PMMA + 5% polystyrene[2] | 50 | 50 |
| PMMA + 10% polystyrene[2] | 50 | 40 |
| PMMA + 5% polystyrene[3] | 60 | 55 |
| PMMA + 20% poly(α-methyl)styrene[4] | 60 | 70 |
| PMMA + 10% poly(p-tert.butyl)styrene | 35 | 30 |
| PMMA + 10% poly(4-methoxy)styrene | 60 | 70 |
| PMMA + 10% novolak | 80 | 105 |
| PMIK | 70 | 90 |
| PMIK + 10% poly(αmethyl)styrene[4] | 40 | 50 |
| PMIK + 10% p-tert.butylbenzoic acid | 100 | 90 |
| silicon | | 35 |

[1]unsubstituted polystyrene having a molecular weight of 30.000
[2]unsubstituted polystyrene having a molecular weight of 100.000
[3]unsubstituted polystyrene having a molecular weight of 233.000
[4]poly(α-methyl)styrene having a molecular weight of 13.000.

Tests were made on some of the resist material mixtures specified in Table C to investigate whether these mixtures are suitable for use as a deep UV resist. In spite of the fact that for these tests no optimum mask was available, it was easy to obtain a resolution of approximately 2 micrometers (layer thickness 0.8 micrometer). The sensitivity values obtained are included in Table D. The sensitivity is expressed as mJ/cm$^2$, that is to say the energy which is at least required during exposure to obtain a clean surface on the exposed portion after development in accordance with standard methods. The PMMA was developed in methyl isobutyl ketone, the PMIK in a mixture of 16 parts by volume of methyl isobutyl ketone plus 6 parts by volume of xylene plus 6 parts by volume of ethyl benzene. From Table D it can be seen that the sensitivity of the resist material mixtures in accordance with the invention is greater than the sensitivity of the positive resist material itself. The action of polystyrene, which itself is a negative-working resist, apparently has no negative effect on the positive action of the mixture.

TABLE D

| Resist material mixture | sensitivity mJ/cm² | |
|---|---|---|
| | after 1× developing | after 2× developing |
| PMMA | >1550 | 1035 |
| PMMA + 20% polystyrene[1] | 1270 | 690 |
| PMMA + 5% polystyrene[2] | 1840 | 1035 |
| PMMA + 10% poly(p-tert.butyl)styrene | 1550 | 800 |
| PMIK | 2070 | |
| PMIK + 10% poly(α-methyl)styrene | 1380 | |

[1]molecular weight 30.000 [2]molecular weight 100.000.

What is claimed is:

1. A method of forming a resist pattern on a substrate wherein a resist material is uniformly applied to the surface of said substrate to form a photosensitive layer thereupon, the resultant layer of resist material is selectively irradiated with actinic radiation and the irradiated portion of said layer is then removed, characterized in that the resist material is a mixture of a positive-working methylmethacrylate polymer or polymethylisopropenyl ketone and 1–25% by weight of a negative-working styrene homopolymer of the formula:

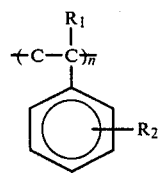

wherein $R_1$ is hydrogen or alkyl, $R_2$ is halogen, alkyl or alkoxy and n represents the degree of polymerization.

2. The method of claim 1, wherein the styrene homopolymer is poly(p-tert.butyl)styrene.

3. A resist material mixture comprising a positive-working methylmethacrylate polymer or polymethylisopropenyl and 1–25% by weight of a negative-working styrene homopolymer of the formula:

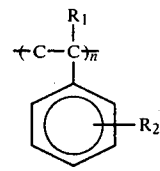

wherein $R_1$ is hydrogen or alkyl, $R_2$ is halogen, alkyl or alkoxy and n represents the degree of polymerization.

4. A resist material mixture as claimed in claim 3, characterized in that the material comprises 1–25% by weight of poly(p-tert.butyl)styrene as the styrene homopolymer.

* * * * *

UNITED STATES PATENT AND TRADEMARK OFFICE
CERTIFICATE OF CORRECTION

PATENT NO. : 4,405,708
DATED : September 20, 1983
INVENTOR(S) : PIETER VAN PELT ET AL It is certified that error appears in the above—identified patent and that said Letters Patent is hereby corrected as shown below:

Column 6, claim 3, line 3, "and" should read -- ketone and --.

Signed and Sealed this

Seventh Day of February 1984

[SEAL]

Attest:

GERALD J. MOSSINGHOFF

Attesting Officer    Commissioner of Patents and Trademarks